(12) United States Patent
Zhong et al.

(10) Patent No.: US 9,306,016 B2
(45) Date of Patent: Apr. 5, 2016

(54) SEMICONDUCTOR DEVICE AND METHOD FOR MANUFACTURING THE SAME

(71) Applicant: Institute of Microelectronics, Chinese Academy of Sciences, Beijing (CN)

(72) Inventors: Huicai Zhong, San Jose, CA (US); Chao Zhao, Kessel-lo (BE); Qingqing Liang, Lagrangeville, NY (US)

(73) Assignee: INSTITUTE OF MICROELECTRONICS CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/423,395

(22) PCT Filed: Sep. 17, 2012

(86) PCT No.: PCT/CN2012/081506
§ 371 (c)(1),
(2) Date: Feb. 23, 2015

(87) PCT Pub. No.: WO2014/029149
PCT Pub. Date: Feb. 27, 2014

(65) Prior Publication Data
US 2015/0228735 A1 Aug. 13, 2015

(30) Foreign Application Priority Data

Aug. 23, 2012 (CN) .......................... 2012 1 0304241

(51) Int. Cl.
*H01L 21/00* (2006.01)
*H01L 29/00* (2006.01)
(Continued)

(52) U.S. Cl.
CPC .... *H01L 29/41783* (2013.01); *H01L 21/02181* (2013.01); *H01L 21/02192* (2013.01);
(Continued)

(58) Field of Classification Search
CPC .................. H01L 21/76224; H01L 21/02192; H01L 21/02194; H01L 21/31111; H01L 21/30604; H01L 29/0653; H01L 21/02181; H01L 21/31116; H01L 29/41783; H01L 29/6656; H01L 29/0847; H01L 29/16; H01L 29/161; H01L 29/7848
See application file for complete search history.

(56) References Cited

U.S. PATENT DOCUMENTS 6,943,385 B2 * 9/2005 Usuda et al. .................. 257/190
7,309,660 B2 * 12/2007 Chen ................. H01L 21/02381
257/E21.132

(Continued)

FOREIGN PATENT DOCUMENTS

| CN | 1 945 854 | 4/2007 |
| CN | 101 300 670 | 11/2008 |
| CN | 102 842 493 | 12/2012 |

*Primary Examiner* — Nikolay Yushin
(74) *Attorney, Agent, or Firm* — Fay Kaplun & Marcin, LLP

(57) ABSTRACT

The present invention provides a method for manufacturing a semiconductor device, which comprises: providing an SOI substrate, which comprises a base layer, an insulating layer located on the base layer and a active layer located on the insulating layer; forming a gate stack on the SOI substrate; etching the active layer, the insulating layer and a part of the base layer of the SOI substrate with the gate stack as a mask, so as to form trenches on both sides of the gate stack; forming a crystal dielectric layer within the trenches, wherein the upper surface of the crystal dielectric layer is lower than the upper surface of the insulating layer and not lower than the lower surface of the insulating layer; and forming source/drain regions on the crystal dielectric layer. The present invention further provides a semiconductor device. The present invention is capable of eliminating pathway for leakage current between source/drain regions and SOI substrate at the meantime of reducing contact resistance at source/drain regions.

21 Claims, 7 Drawing Sheets

(51) Int. Cl.

| | | |
|---|---|---|
| *H01L 29/417* | (2006.01) | |
| *H01L 29/66* | (2006.01) | |
| *H01L 29/786* | (2006.01) | |
| *H01L 21/02* | (2006.01) | |
| *H01L 21/306* | (2006.01) | |
| *H01L 21/311* | (2006.01) | |
| *H01L 21/762* | (2006.01) | |
| *H01L 29/06* | (2006.01) | |
| *H01L 29/08* | (2006.01) | |
| *H01L 29/16* | (2006.01) | |
| *H01L 29/161* | (2006.01) | |
| *H01L 29/78* | (2006.01) | |
| *H01L 29/165* | (2006.01) | |

(52) U.S. Cl.
CPC .... *H01L21/02194* (2013.01); *H01L 21/30604* (2013.01); *H01L 21/31111* (2013.01); *H01L 21/31116* (2013.01); *H01L 21/76224* (2013.01); *H01L 29/0653* (2013.01); *H01L 29/0847* (2013.01); *H01L 29/16* (2013.01); *H01L 29/161* (2013.01); *H01L 29/165* (2013.01); *H01L 29/6656* (2013.01); *H01L 29/66636* (2013.01); *H01L 29/66772* (2013.01); *H01L 29/66825* (2013.01); *H01L 29/7848* (2013.01); *H01L 29/78654* (2013.01)

(56) References Cited

U.S. PATENT DOCUMENTS

| | | | |
|---|---|---|---|
| 8,466,500 B2* | 6/2013 | Zhu et al. | 257/255 |
| 8,525,186 B2* | 9/2013 | Cheng | H01L 29/1079 257/347 |
| 2004/0094758 A1* | 5/2004 | Usuda et al. | 257/18 |
| 2006/0084235 A1 | 4/2006 | Barr et al. | |
| 2011/0204384 A1* | 8/2011 | Cheng | H01L 29/1079 257/77 |
| 2011/0260214 A1* | 10/2011 | Zhu et al. | 257/192 |

\* cited by examiner

SEMICONDUCTOR DEVICE AND METHOD FOR MANUFACTURING THE SAME

CROSS REFERENCE TO RELATED APPLICATION

This application is a national stage application, filed under 35 U.S.C. §371, of PCT Patent Application Serial No. PCT/CN2012/081506, filed on Sep. 17, 2012, entitled "SEMICONDUCTOR DEVICE AND METHOD FOR MANUFACTURING THE SAME", which claimed priority to Chinese Patent Application Serial No. 201210304241.6, filed on Aug. 23, 2012, all of which are hereby incorporated by reference in their entirety.

FIELD OF THE INVENTION

The present invention relates to semiconductor manufacturing field, particularly, to a semiconductor device and a method for manufacturing the same.

BACKGROUND OF THE INVENTION

In traditional semiconductor manufacturing field, forming strained source/drain regions in semiconductor devices has become a significant mean for improving performance of semiconductor devices by generating compressive stress or tensile stress onto channels, which accordingly enhances carriers mobility inside channels. Specific processes for manufacturing said semiconductor devices are described here below in conjunction with FIG. 1(a): providing a bulk Si substrate 100 that has a gate stack; firstly, etching the bulk Si substrate 100 on both sides of the gate stack to form trenches; then filling, for example Boron doped SiGe or Phosphorus/Arsenic doped Si:C into the trenches to form strained source/drain regions 110.

However, since leakage current that occurs between source/drain regions 110 and the bulk Si substrate 100 may deteriorate performance of semiconductor devices, bulk Si substrates have been replaced by Silicon-On-Insulator (SOI) in the prior art for reducing leakage current between substrates and source/drain regions. As shown in FIG. 1(b), the SOI substrate 100' comprises a base layer 101, an insulating layer 102 and an active layer 103. Embedded source/drain regions 110 are formed in the active layer 103 of the SOI substrate 100'. Due to presence of the insulating layer 102, the source/drain regions 110 are separated from the base layer 101, which effectively eliminates pathway for leakage current (with reference to areas enclosed by dotted lines in FIG. 1(a) and FIG. 1(b)) and accordingly suppresses leakage current between the substrate 100' and the source/drain regions 110. Nonetheless, since the active layer 103 of the SOI substrate is usually thin, the source/drain regions 110 formed thereon do not extend deeply due to thickness of the active layer 103. Consequently, contact resistance at the source/drain regions 110 may increase, and performance of semiconductor devices may deteriorate.

Accordingly, it is needed to solve such problems as how to reduce contact resistance at source/drain regions while suppressing leakage current between substrate and source/drain regions.

SUMMARY OF THE INVENTION

The present invention is intended to provide a semiconductor device and a method for manufacturing the same, which are capable of eliminating pathway for leakage current between SOI substrate and source/drain regions at the meantime of reducing contact resistance at source/drain regions.

In one aspect, the present invention provides a method for manufacturing a semiconductor device, which comprises following steps:

(a) providing an SOI substrate, which comprises a base layer, an insulating layer located on the base layer, and a active layer located on the insulating layer;

(b) forming a gate stack on the SOI substrate;

(c) etching the active layer, the insulating layer and a part of the base layer of the SOI substrate with the gate stack as a mask, so as to form trenches on both sides of the gate stack;

(d) forming a crystal dielectric layer within the trenches; wherein the upper surface of the crystal dielectric layer is lower than the upper surface of the insulating layer and not lower than the lower surface of the insulating layer; and (e) forming source/drain regions on the crystal dielectric layer.

In another aspect, the present invention further provides a semiconductor device, which comprises:

an SOI substrate comprising a base layer, an insulating layer located on the base layer and a active layer located on the insulating layer;

a gate stack formed on the SOI substrate;

source/drain regions, which are formed in the SOI substrate on both sides of the gate stack; wherein the source/drain regions penetrate through the active layer and extend into between the upper surface and lower surface of the insulating layer; and a crystal dielectric layer located between the source/drain regions and the base layer.

As compared to the prior art, the present invention exhibits following advantages:

1) Bottoms of source/drain regions are located within the insulating layer of the SOI substrate, and a crystal dielectric layer is formed between source/drain regions and the SOI substrate, such that bottoms of the source/drain regions are separated from the SOI substrate, which therefore effectively eliminates pathway for leakage current between source/drain regions and the SOI substrate, and suppresses occurrence of leakage current accordingly;

2) source/drain regions are formed in the active layer and a part of the insulating layer of the SOI substrate, which accordingly eliminating the defect in the prior art of forming fairly thin source/drain regions merely in active layer, therefore reduces contact resistance at source/drain regions and enhances performance of semiconductor devices accordingly.

BRIEF DESCRIPTION OF THE DRAWINGS

Other additional features, objects and advantages of the present invention are made more evident after reading the following detailed description of exemplary embodiment(s) in conjunction with accompanying drawings.

The same or similar reference numbers in the drawings denote the same or similar elements.

DETAILED DESCRIPTION OF THE INVENTION

Figure 1A:
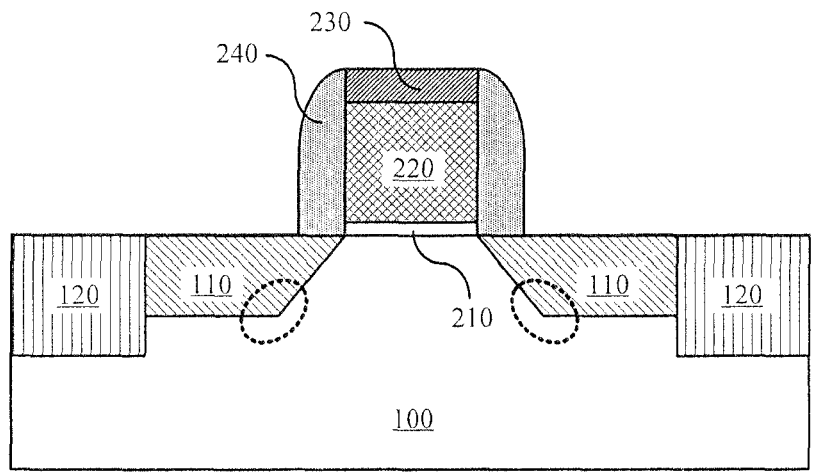
FIG. 1(a) and FIG. 1(b) illustrate cross-sectional views of a semiconductor device according to prior art.
Figure 1B:
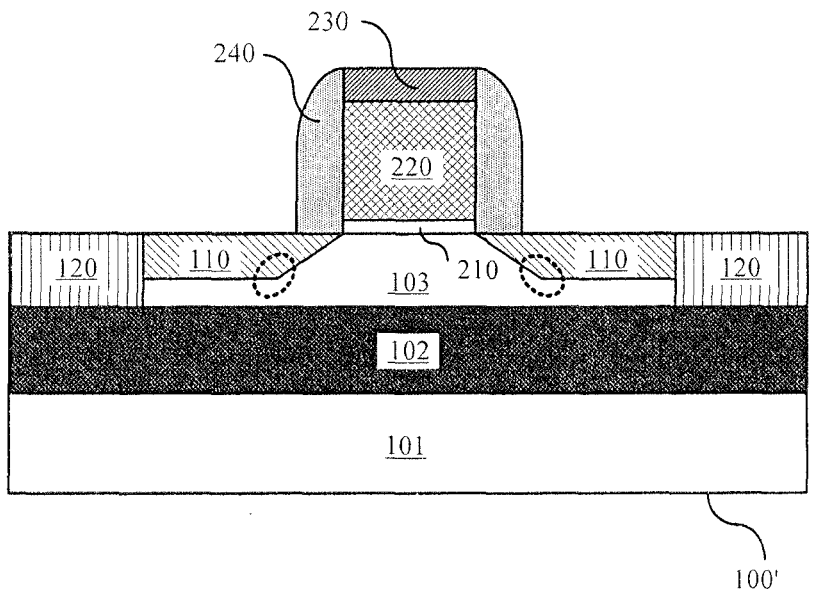

Embodiments of the present invention will be described in detail below. Examples of embodiments are illustrated in the drawings, and the same or similar reference numbers throughout denote the same or similar elements or elements having the same or similar functions. It should be noted that embodiments described below in conjunction with the drawings are illustrative, and are provided for explaining the present invention only, and thus shall not be interpreted as a limit to the present invention.

Various embodiments or examples are provided here below to implement different structures of the present invention. To simplify the disclosure of the present invention, descriptions of components and arrangements of specific examples are given below. Of course, they are only illustrative and are not intended to limit the present invention. Moreover, in the present invention, reference numbers and/or letters may be repeated in different examples. Such repetition is for purposes of simplicity and clarity, and does not denote any relationship between respective embodiments and/or arrangements under discussion. Furthermore, the present invention provides various examples for various processes and materials. However, it is obvious for a person of ordinary skill in the art that other processes and/or materials may be alternatively utilized. In addition, structures where a first feature is "on/above" a second feature may include an embodiment in which the first feature and the second feature are formed to be in direct contact with each other, and may also include an embodiment in which another feature is formed between the first feature and the second feature such that the first and second features might not be in direct contact with each other. However, it should be noted that elements shown in appended drawings might not be drawn to scale. Description of the conventionally known elements, processing techniques and crafts are omitted from description of the present invention in order not to limit the present invention unnecessarily.

Figure 2:
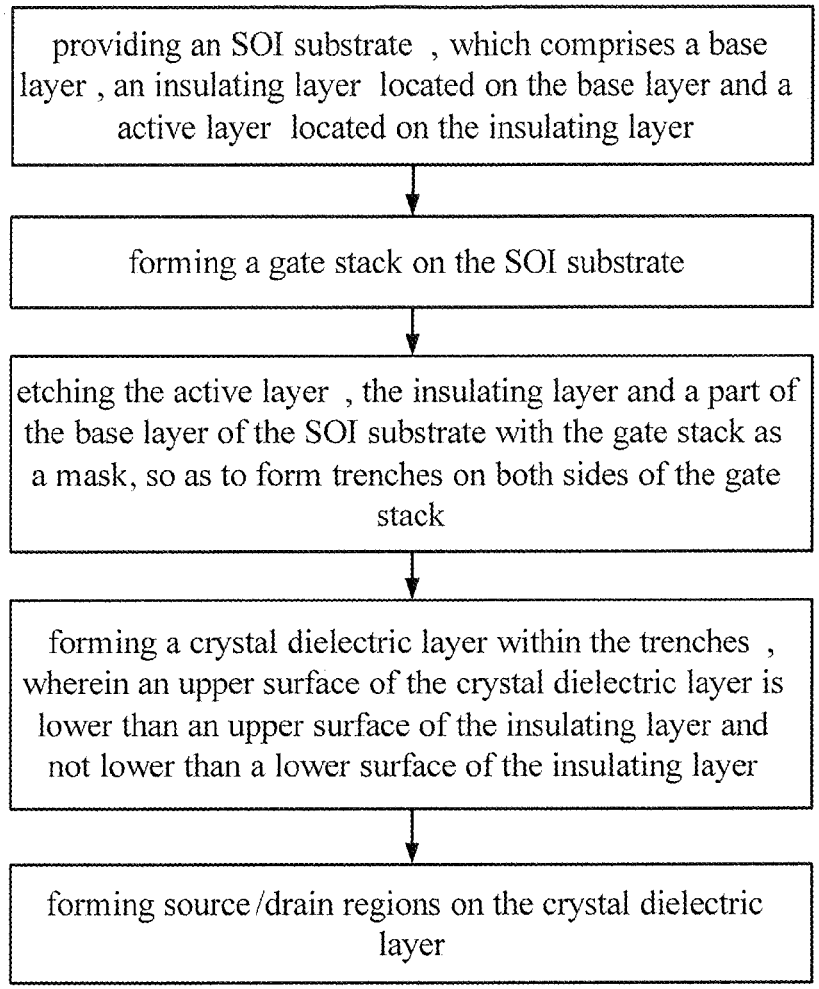
FIG. 2 illustrates a diagram of a method for manufacturing a semiconductor device according to the present invention.

FIG. 2 illustrates a diagram of a method for manufacturing a semiconductor device according to the present invention. FIG. 3 to FIG. 11 respectively illustrate cross-sectional views of a semiconductor device manufactured at respective stages according to an embodiment of the method for manufacturing a semiconductor device as illustrated in FIG. 2. Hereafter, the method for manufacturing a semiconductor device as shown in FIG. 2 is described in detail. However, it should be noted that appended drawings for embodiments of the present invention are provided for the purpose of illustration, and are not necessarily drawn to scale.

At step S101, an SOI substrate 100 is provided. The SOI substrate 100 comprises a base layer 101, an insulating layer 102 located on the base layer 101, and a active layer 103 located on the insulating layer 102.

Figure 3:
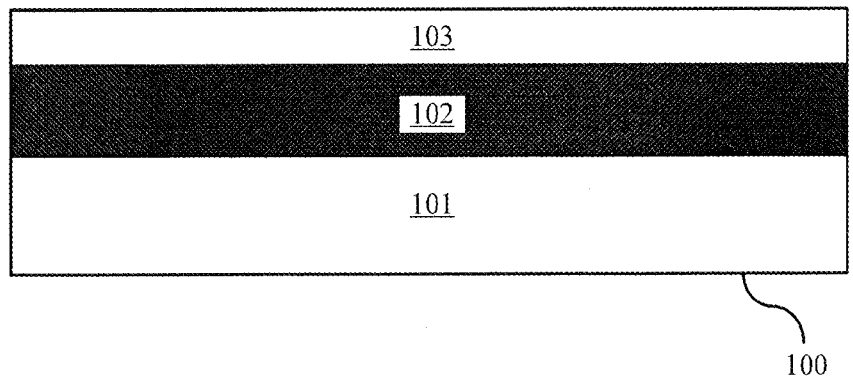
FIG. 3 to FIG. 11 illustrate cross-sectional views of a semiconductor device manufactured at respective stages according to an embodiment of the method for manufacturing a semiconductor device as illustrated in FIG. 2, respectively.

Specifically, the base layer 101 is monocrystalline Si in the present embodiment, as shown in FIG. 3. In other embodiments, the base layer 101 may further comprise other basic semiconductors, for example germanium. Alternatively, the base layer 101 may comprise a compound semiconductor, such as SiC, GaAs, InAs or InP. Typically, the base layer 101 may have, but not limited to, a thickness of about several hundred micrometers, for example, in the range of about 0.5 mm-1.5 mm.

The insulating layer 102 may be $SiO_2$, $Si_3N_4$ or any other insulating materials as appropriate. Typically, the thickness of the insulating layer 102 is in the range of about 200 nm-300 nm.

The active layer 103 may be any one of semiconductors that the base layer 101 comprises. In the present embodiment, the device layer 103 is monocrystalline Si. In other embodiments, the device layer 103 may further comprise other base semiconductors or compound semiconductors. Typically, the thickness of the active layer 103 is greater than 20 nm.

In the present embodiment, the SOI substrate is an ultra-thin body SOI (UTBSOI) substrate, which has an ultra-thin active layer with a thickness usually less than 10 nm, and is favorable for controlling depth of source/drain regions and suppressing short-channel effects.

Particularly, an isolation region, for example, a shallow trench isolation (STI) structure 120, is formed in the SOI substrate 100 for electrically isolating adjacent semiconductor devices.

At step S102, a gate stack is formed on the SOI substrate 100.

Figure 4:
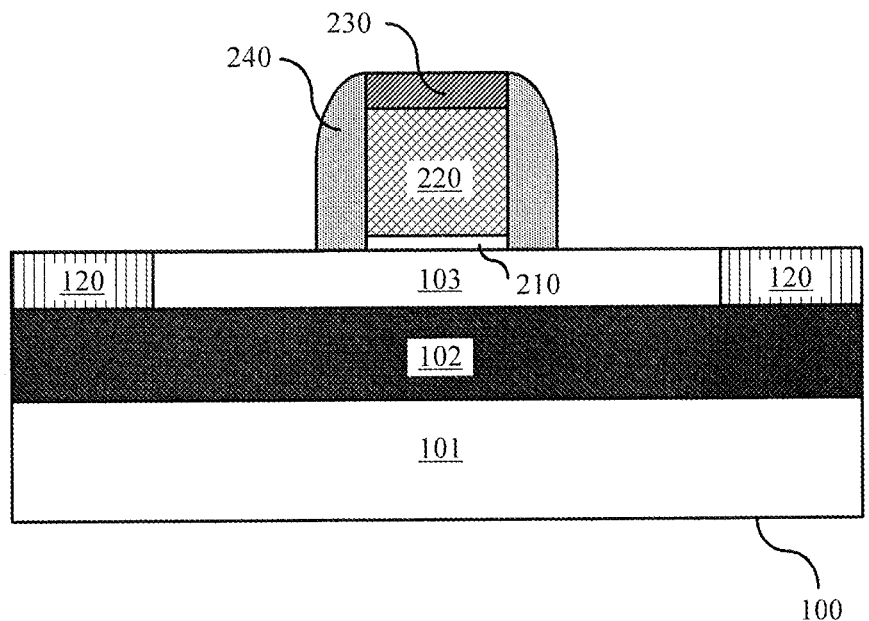

Specifically, as shown in FIG. 4, a gate stack is formed on the SOI substrate 100. The gate stack comprises a gate dielectric layer 210, a gate electrode 220 and a cap layer 230. The gate dielectric layer 210, which is located on the SOI substrate 100, may be high k dielectrics, for example, any one of $HfO_2$, HfSiO, HfSiON, HfTaO, HfTiO, HfZrO, $Al_2O_3$, $La_2O_3$, $ZrO_2$, LaAlO or combinations thereof. In another embodiment, it may be a thermal oxide layer, such as $SiO_2$ or $SiO_xN_y$. The thickness of the gate dielectric layer 210 may be in the range of about 2 nm-10 nm, for example, 5 nm or 8 nm. Then, a gate electrode 220 is formed on the gate dielectric layer 210, and the gate electrode 220 may be a metal gate, which is formed by depositing any one of TaC, TiN, TaTbN, TaErN, TaYbN, TaSiN, HfSiN, MoSiN, $RuTa_x$, $NiTa_x$ or combinations thereof. The thickness thereof may be in the range of about 10 nm-80 nm, for example, 30 nm or 50 nm. In another embodiment, the gate electrode 220 may further be a dummy gate formed by, for example, depositing Poly-Si, Poly-SiGe, amorphous Si and/or oxides. Finally, a cap layer 230 is formed on the gate 220 by, for example, depositing $Si_3N_4$, $SiO_2$, $SiO_xN_y$, SiC or combinations thereof, so as to protect the top of the gate electrode 220 from damages arising at subsequent processes.

Preferably, spacers 240 are formed on sidewalls of the gate stack for purposes of isolating the gate stack. The spacers 240 may be formed with any one selected from a group consisting of $Si_3N_4$, $SiO_2$, $SiO_xN_y$, SiC or combinations thereof, and/or other materials as appropriate. The spacers 240 may be in multi-layer structure. The spacers 240 may be formed by depositing-etching process and have a thickness in the range of 10 nm-100 nm, for example 30 nm, 50 nm or 80 nm.

At step S103, the active layer 103, the insulating layer 102 and a part of the base layer 101 of the SOI substrate 100 are etched with the gate stack as a mask, so as to form trenches 104 on both sides of the gate stack.

Figure 5A:
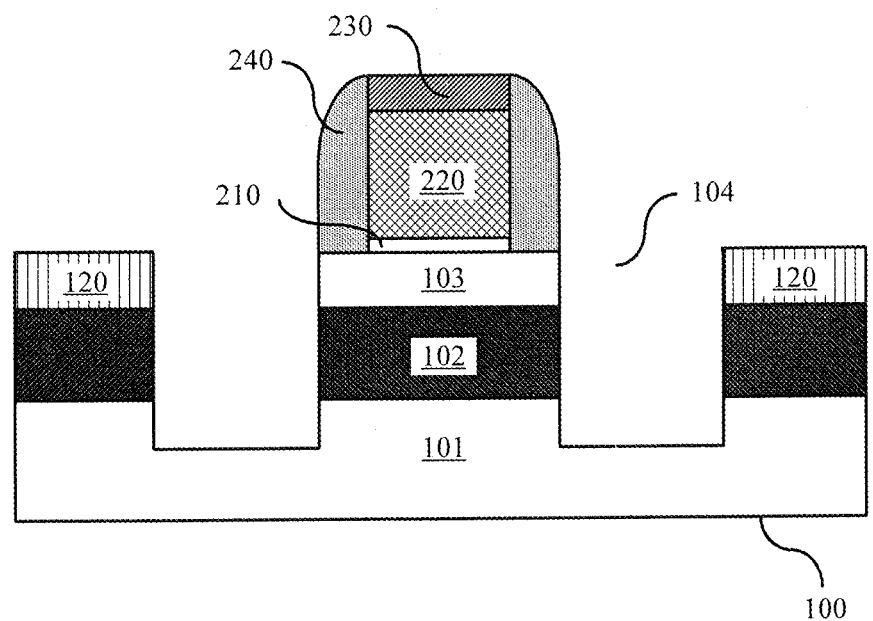

As shown in FIG. 5(a), trenches 104 are formed on both sides of the gate stack by etching the active layer 103, the insulating layer 102 and a part of the base layer 101 of the SOI substrate 100. Specifically, the SOI substrate on both sides of the gate stack is etched by means of anisotropic dry etching and/or wet etching to form the trenches 104 that penetrate through the active layer 103 and the insulating layer 102 and extend into the base layer 101. The trenches 104 extend into the base layer 101 for about 100 nm to 1 μm. In the wet etching process, TMAH, KOH or other etching solutions as appropriate may be utilized, while in the dry etching process, SF$_6$, HBr, HI, Cl, Ar, He or combinations thereof, and/or other materials as appropriate may be utilized. Appropriate etching process may be used to etch the materials for the active layer 103, the insulating layer 102 and the base layer 101.

Figure 5B:
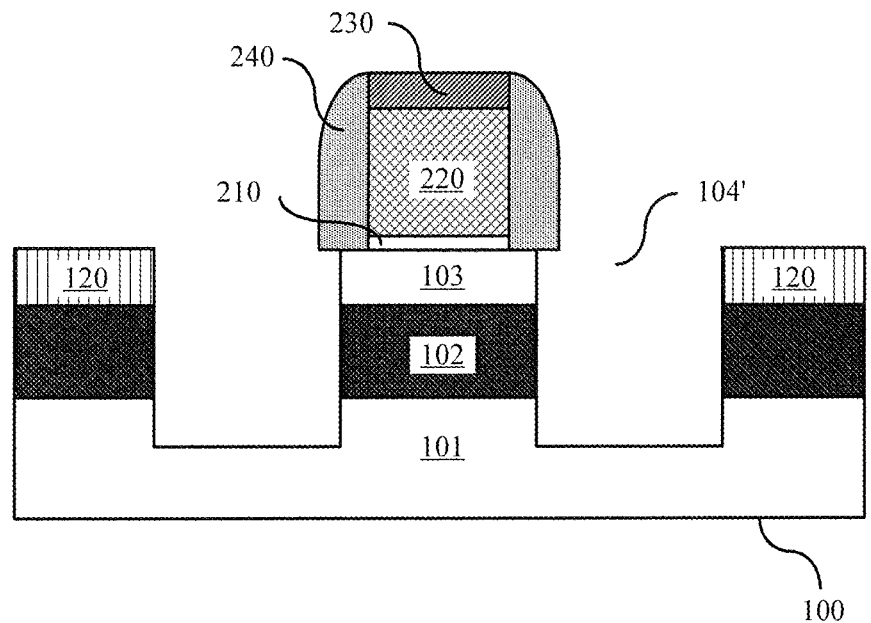
Figure 5C:
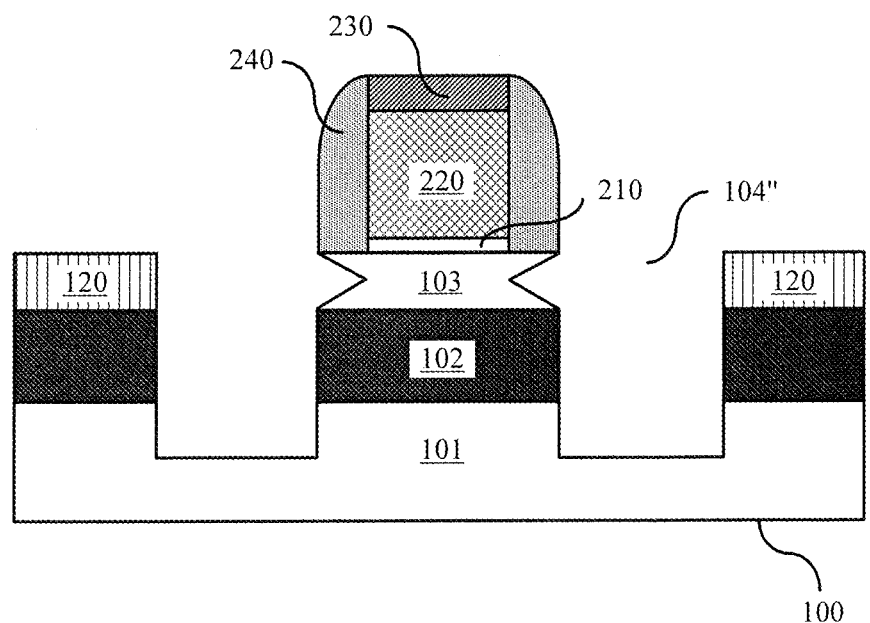

Preferably, not only the SOI substrate 100 on both sides of the gate stack but also a part of the SOI substrate 100 under the spacers 240, particularly the active layer 103 in the SOI substrate 100, are etched by alternative anisotropic and isotropic etching processes, such that the trenches after the etching, for example, the trenches 104' in FIG. 5(b) or the trenches 104" in a Sigma shape as shown in FIG. 5(c), can be formed as close to the center of the channel as possible. In the subsequent process, source/drain regions 107 are formed by filling of the trenches. The closer to the center of the channel the source/drain regions 107 are located, the more efficiently the stress are applied to the carriers in the channel. The step for partially etching the substrate under the spacers 240, particularly, the step for etching the active layer 103 in the SOI substrate 100 so that the trenches 104 are closer to the center of the channel, may be performed when forming the source/drain regions later.

At step S104, a crystal dielectric layer 105 is formed within the trenches 104. The upper surface of the crystal dielectric layer 105 is lower than the upper surface of the insulating layer 102 and not lower than the lower surface of the insulating layer 102.

Figure 6:
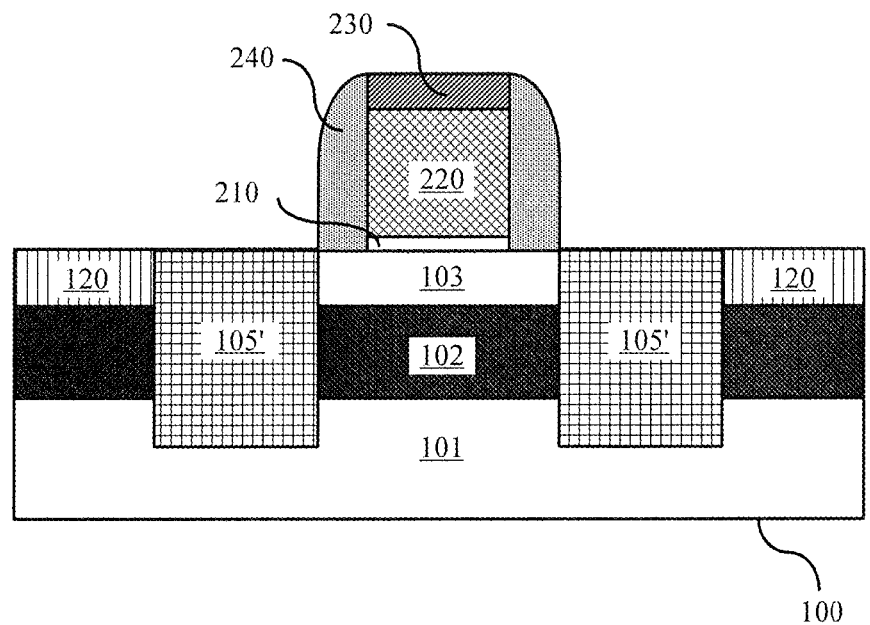
Figure 7:
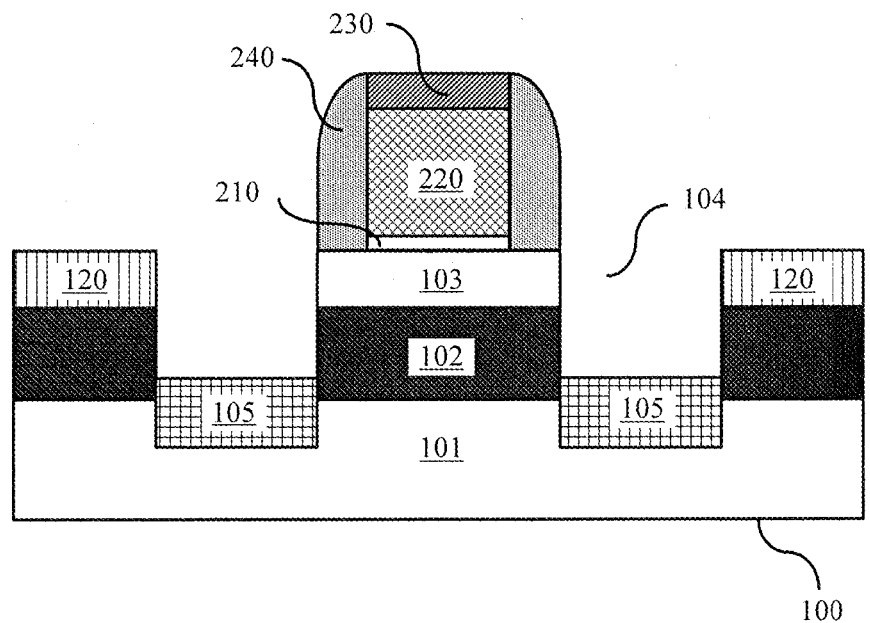

Specifically, the crystal insulating material 105' is formed within the trenches 104 by means of epitaxial growth or solid-phase transformation with the base layer 101 as a seed, so that the upper surface of the crystal insulating material 105' is not higher than the bottom of the gate stack, as shown in FIG. 6. Next, as shown in FIG. 7, the crystal insulating material 105' is etched by dry etching and/or wet etching to form the crystal dielectric layer 105. Alternatively, the crystal dielectric layer 105 may also be formed by, for example, controlling growing period of the crystal insulating material 105' such that the crystal insulating material 105' stops growing at a desired height. The upper surface of the crystal dielectric layer 105 is lower than the upper surface of the insulating layer 102 and not lower than the lower surface of the insulating layer 102. The material for the crystal dielectric layer 105 comprises, but not limited to, any one of Gd$_2$O$_3$, TrHfO$_4$, Nd$_2$O$_3$ or combinations thereof, or any other material whose lattice constant is close to that of material for the base layer 101. The dielectric constant of the crystal dielectric layer 105 may be adjusted by adjusting proportion of components of the material for the crystal dielectric layer 105, such that the crystal dielectric layer 105 exhibits excellent insulating property.

At step S105, the source/drain regions 107 are formed on the crystal dielectric layer 105.

Figure 8:
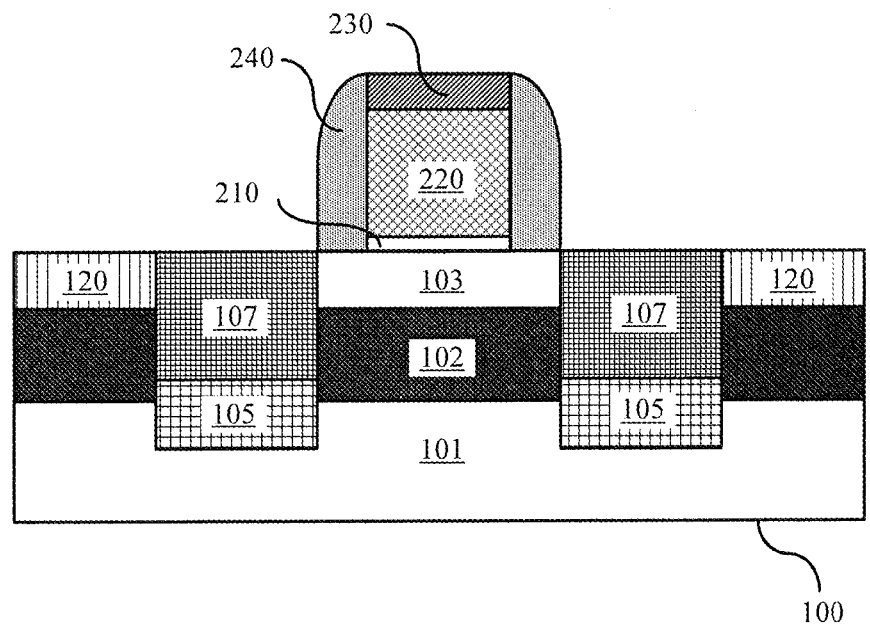

Specifically, doped source/drain regions 107 are formed within the trenches 104 by means of epitaxial growth or solid-phase transformation with the crystal dielectric layer 105 as a seed, as shown in FIG. 8. In an embodiment of the present invention, the lattice constant of the source/drain regions 107 is not equal to the lattice constant of the material for the active layer 103. Under circumstances where the lattice constant of the source/drain regions 107 is slightly larger or smaller than the lattice constant of the material for the active layer 103, it not only introduces a stress to the channels, but also enables the source/drain regions 107 to grow on the crystal dielectric layer 105. With respect to PMOS devices, the lattice constant of the source/drain regions 107 is slightly larger than the lattice constant of the material for the active layer 103 so as to generate compressive stress onto channels; for example, the material for the source/drain regions 107 may be Si$_{1-x}$Ge$_x$, wherein x is in the range of 0.1~0.7, such as 0.2, 0.3, 0.4, 0.5 or 0.6; with respect to NMOS devices, the lattice constant of the source/drain regions 107 is slightly smaller than the lattice constant of the material for the active layer 103 so as to generate tensile stress onto channels; for example, the material for the source/drain regions 107 may be Si:C, in which the carbon atom percentage is in the range of 0.2%-2%, such as 0.5%, 1% or 1.5%. After formation of source/drain regions 107 within the trenches 104, source/drain regions 107 may be formed by means of, for example, ion implantation or in-situ doping, or, source/drain regions 107 may be formed by growing source/drain regions 107 at the meantime of performing in-situ doping. For Si$_{1-x}$Ge$_x$, the dopants are B; for Si:C, the dopants are P or As.

Figure 9:
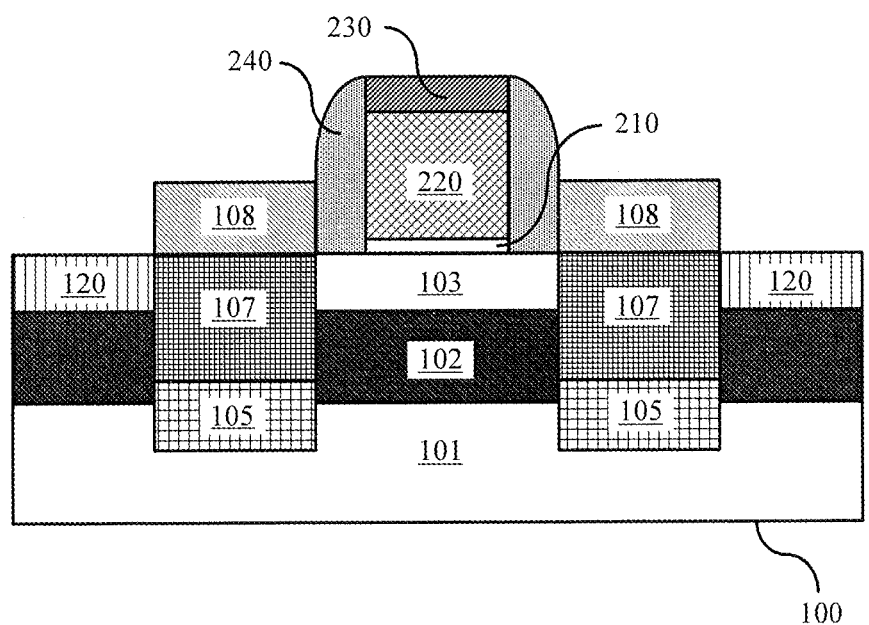
Figure 11:
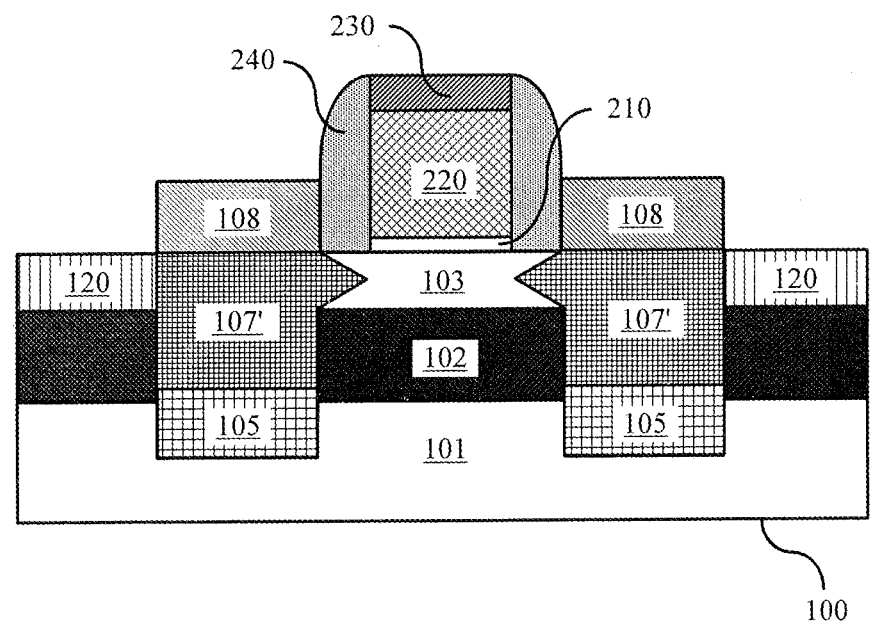

Preferably, as shown in FIG. 9 or FIG. 11, in order to further improve performance of semiconductor devices, raised source/drain regions 108 may be formed by means of epitaxial growth after formation of the source/drain regions 107 or source/drain regions 107'; namely, heads of the source/drain regions are higher than the bottom of the gate stack.

Manufacture of the semiconductor device is completed according to conventional steps in prior art, for example, forming a metal silicide layer on the source/drain regions; depositing an interlayer dielectric layer to cover the source/drain regions and the gate stack; etching the interlayer dielectric layer till the source/drain regions are exposed so as to form contact holes; and then filling contact metal into the contact holes.

After completion of aforementioned steps, bottoms of the source/drain regions 107 are located within the insulating layer 102 of the SOI substrate 100; besides, due to presence of the crystal dielectric layer 105 between the source/drain regions 107 and the base layer 101, bottoms of the embedded source/drain regions 107 can be effectively separated from the SOI substrate 100, pathway for leakage current between the source/drain regions 107 and the SOI substrate 100 is eliminated, and occurrence of leakage current is suppressed accordingly. Additionally, the source/drain regions 107 penetrate through entirely the active layer 103 and go partially into the insulating layer 102 of the SOI substrate 100, which therefore eliminates shortcoming of thin source/drain regions formed merely in a active layer according to the prior art, effectively increases depth of source/drain region, thereby reducing contact resistance at source/drain region and improving performance of semiconductor device.

The present invention further provides a semiconductor device, as shown in FIG. 8. As shown, the semiconductor device comprises an SOI substrate 100, a gate stack, source/drain regions 107 and a crystal dielectric layer 105. Wherein, the SOI substrate 100 comprises a base layer 101, an insulating layer 102 located on the base layer 101 and a active layer 103 located on the insulating layer 102. Preferably, the thickness of the active layer 103 is less than 10 nm; the gate stack, which is formed on the SOI substrate 100, comprises a gate dielectric layer 210, a gate electrode 220 and a cap layer 230; the source/drain regions 107 are formed within the SOI substrate 100 on both sides of the gate stack; wherein the source/drain regions 107 penetrate through the active layer 103 and extend into between the upper surface and lower surface of the insulating layer 102; the crystal dielectric layer 105 is sandwiched between source/drain regions 107 and the base layer 101; wherein, the crystal dielectric layer 105 goes as deep as 100 nm-1 μm into the base layer 101; the material for the crystal dielectric layer 105 comprises, but is not limited to, any one selected from a group consisting of $Gd_2O_3$, $TrHfO_4$, $Nd_2O_3$ or combinations thereof, or any other material with a lattice constant close to that of the material for the base layer 101. In other embodiments, the semiconductor device further comprises spacers 240 that are formed on sidewalls of the gate stack.

The source/drain regions 107 contain dopants; wherein, the lattice constant of the doped source/drain regions 107 is slightly larger or slightly smaller than the lattice constant of the material for the active layer 103, therefore, it generates stress onto channels and improves carriers mobility within channels. With respect to PMOS devices, the lattice constant of the source/drain regions 107 is slightly larger than the lattice constant of the material for the active layer 103 so as to generate compressive stress onto channels; for example, the material for the source/drain regions may be $Si_{1-x}Ge_x$, wherein x is in the range of 0.1~0.7, such as 0.2, 0.3, 0.4, 0.5 or 0.6; with respect to NMOS devices, the lattice constant of the source/drain regions 107 is slightly smaller than the lattice constant of the material for the active layer 103 so as to generate tensile stress onto channels; for example, the material for the source/drain regions 107 may be Si:C, in which the carbon atom percentage is in the range of 0.2%~2%, such as 0.5%, 1% or 1.5%.

Figure 10:
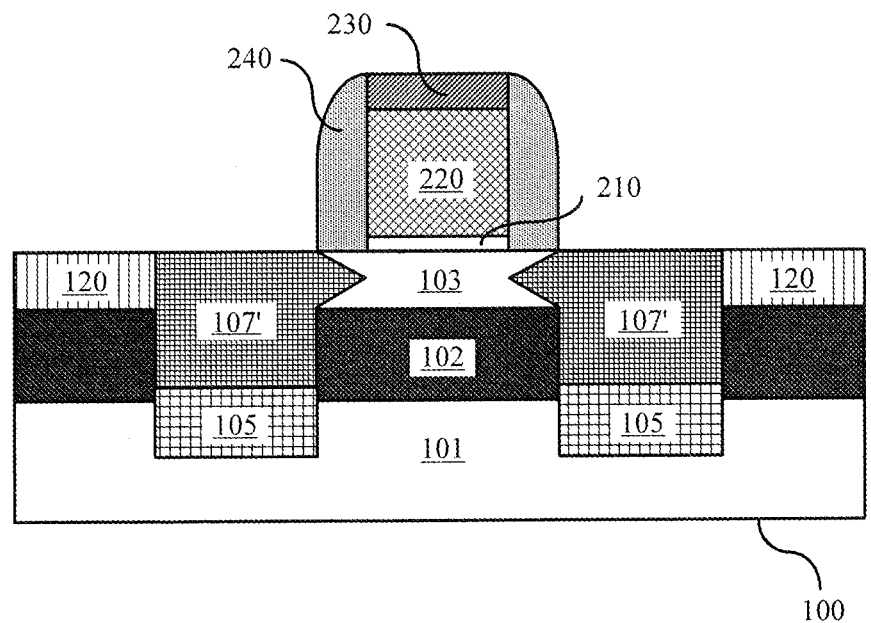

Preferably, the source/drain regions may be source/drain regions 107' in the shape of Sigma, as shown in FIG. 10. As shown, under circumstances the source/drain regions 107' is in the shape of Sigma, the source/drain regions 107' can be much closer to channel center of the semiconductor device so as to enable the source/drain regions 107' to provide better stress effects onto channels.

Preferably, the source/drain regions may be raised source/drain regions, namely, heads of the source/drain regions are higher than the bottom of the gate stack, with reference to the source/drain regions 108 shown in FIG. 9 and FIG. 11.

Wherein, since structural constitution, materials and formation methods of respective parts of the semiconductor device in respective embodiments may be same as embodiments of aforesaid method for manufacturing a semiconductor device, thus they are not described here in detail in order not to obscure. Although the exemplary embodiments and their advantages have been described in detail, it should be understood that various alternations, substitutions and modifications may be made to the embodiments without departing from the spirit of the present invention and the scope as defined by the appended claims. For other examples, it may be easily recognized by a person of ordinary skill in the art that the order of processing steps may be changed without departing from the scope of the present invention.

In addition, the scope to which the present invention is applied is not limited to the process, mechanism, manufacture, material composition, means, methods and steps described in the specific embodiments in the specification. According to the disclosure of the present invention, a person of ordinary skill in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What is claimed is:

1. A method for manufacturing a semiconductor device, comprising:
    (a) providing an SOI substrate (100), which comprises a base layer (101), an insulating layer (102) located on the base layer (101) and a active layer (103) located on the insulating layer (102);
    (b) forming a gate stack on the SOI substrate (100);
    (c) etching the active layer (103), the insulating layer (102) and a part of the base layer (101) of the SOI substrate (100) with the gate stack as a mask, so as to form trenches (104) on both sides of the gate stack;
    (d) forming a crystal dielectric layer (105) within the trenches (104), wherein an upper surface of the crystal dielectric layer (105) is lower than an upper surface of the insulating layer (102) and not lower than a lower surface of the insulating layer (102); and
    (e) forming source/drain regions (107) on the crystal dielectric layer (105).

2. The method of claim 1, wherein after the step (b), the method further comprises: (f) forming spacers (240) on sidewalls of the gate stack.

3. The method of claim 1, wherein the thickness of the active layer (103) of the SOI substrate (100) is less than 10 nm.

4. The method of claim 1, further comprising forming raised source/drain regions (108) after formation of the source/drain regions (107).

5. The method of claim 1, wherein:
    the trenches (104) are embedded into the base layer (101) for about 100 nm to 1 μM.

6. The method of claim 5, further comprising forming the trenches (104) having a Sigma shape on sidewalls of the active layer (103).

7. The method of claim 1, wherein the step for forming a crystal dielectric layer (105) within the trenches (104) comprises:
    forming a crystal insulating material (105') within the trenches (104) by means of epitaxial growth or solid-phase transformation, wherein an upper surface of the crystal insulating material (105') is not higher than a bottom of the gate stack; and
    etching the crystal insulating material (105') to form the crystal dielectric layer (105) by means of dry etching and/or wet etching.

8. The method of claim 7, wherein:
    a material for the crystal dielectric layer (105) comprises any one of $Gd_2O_3$, $TrHfO_4$ and $Nd_2O_3$, or combinations thereof, or other materials having a lattice constant close to that of the material for the base layer (101).

9. The method of claim 1, wherein:
    a lattice constant of the source/drain regions (107) is not equal to that of the active layer (103).

10. The method of claim 9, wherein:
    for N-type devices, the lattice constant of the source/drain regions (107) is smaller than that of the active layer (103); and for P-type devices, the lattice constant of the source/drain regions (107) is larger than that of the active layer (103).

11. The method of claim 9, wherein:
    the source/drain regions (107) comprises SiGe or Si:C.

12. A semiconductor device comprising:
- an SOI substrate (100), which comprises a base layer (101), an insulating layer (102) located on the base layer (101) and a active layer (103) located on the insulating layer (102);
- a gate stack formed on the SOI substrate (100);
- source/drain regions (107) formed within the SOI substrate (100) on both sides of the gate stack, wherein the source/drain regions (107) penetrate through the active layer (103) and extend to between upper and lower surfaces of the insulating layer (102); and
- a crystal dielectric layer (105) located entirely under the source/drain regions (107) and directly on the base layer (101).

13. The semiconductor device of claim 12, further comprising:
- spacers (240) formed on sidewalls of the gate stack.

14. The semiconductor device of claim 12, wherein a thickness of the active layer (103) of the SOI substrate (100) is less than 10 nm.

15. The semiconductor device of claim 12, wherein the source/drain regions (107) have a Sigma shape.

16. The semiconductor device of claim 12, wherein the source/drain regions are raised source/drain regions.

17. The semiconductor device of claim 12, wherein:
the crystal dielectric layer (105) is embedded into the base layer (101) for about 100 nm to 1 μm.

18. The semiconductor device of claim 17, wherein:
a material for the crystal dielectric layer (105) comprises any one of $Gd_2O_3$, $TrHfO_4$, $Nd_2O_3$ or combinations thereof, or other materials whose lattice constant is close to that of the base layer (101).

19. The semiconductor device of claim 12, wherein:
the source/drain regions (107) have a lattice constant not equal to that of the active layer (103).

20. The semiconductor device of claim 19, wherein:
for N-type devices, the lattice constant of the source/drain regions (107) is smaller than that of the active layer (103); and for P-type devices, the lattice constant of the source/drain regions (107) is larger than that of the active layer (103).

21. The semiconductor device of claim 19, wherein:
the source/drain regions (107) comprise SiGe or Si:C.

* * * * *